DEVICE FOR VARYING THE FREQUENCY OF AN OSCILLATOR

Filed March 9, 1959

INVENTOR
JOANNES P.M. GIELES
BY
Frank R. Jifari
AGENT

United States Patent Office 3,061,801

Patented Oct. 30, 1962

3,061,801

DEVICE FOR VARYING THE FREQUENCY OF AN OSCILLATOR

Joannes Paulus Maria Gieles, Eindhoven, Netherlands, assignor to North American Philips Company, Inc., New York, N.Y., a corporation of Delaware Filed Mar. 9, 1959, Ser. No. 798,071
Claims priority, application Netherlands Mar. 20, 1958
6 Claims. (Cl. 332—23)

The present invention relates to devices for varying the frequency of an oscillator, comprising two amplifier elements, each with such a feedback-circuit that these amplifier elements on their own would produce oscillations having different frequencies under the influence of a control signal, which feedback-circuits are however coupled together so as to produce a common oscillation, the frequency of which depends upon the difference in amplification of both amplifier elements. Such a device is, for example, described prior Dutch Patent 32,122.

The present invention has for its object to make this device suitable for very high frequencies. It has the feature that the feedback-circuits are balanced in such manner that an oscillation supplied from the output electrode of one amplifier to the feedback-circuit produces practically an oscillation zero at the output electrode of the other amplifier. The invention is based on the realisation that this yields the maximum frequency sweep and the least influence of the temperature and/or the temperature of the applied supply voltages.

Figure 1:
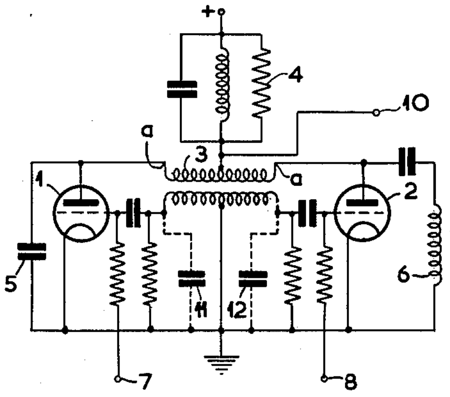

In order that the invention may be readily carried into effect it will now be explained in detail with reference to the accompanying drawing, in which:

FIG. 1 shows an example of the invention, in which a T-network is used to constitute a feedback-circuit.

Figure 2:
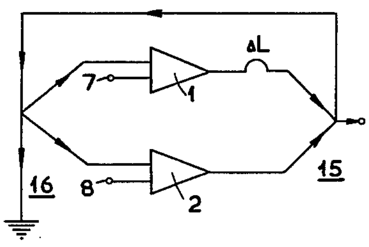

In the example shown in FIG. 2, a magic T is shown instead thereof.

Figures 3, 4:
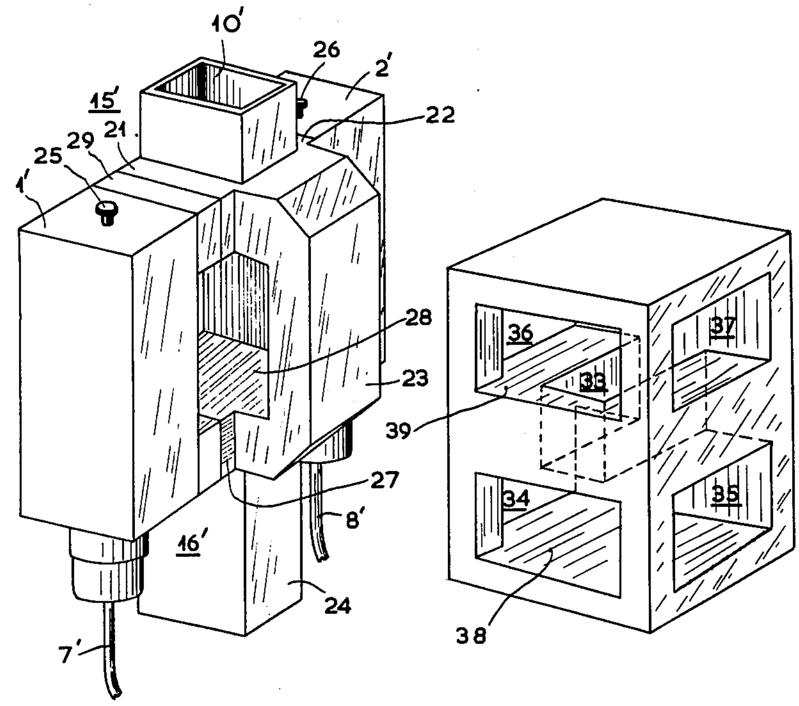

FIGS. 3 and 4 show examples of such magic T's for use in the device shown in FIG. 2.

The device shown in FIG. 1 comprises two amplifier elements 1 and 2. The amplifier 1 has a feedback-circuit made up of a transformer 3, a parasitic capacitance 11, a tuned circuit 4 and a capacitor 5. If the amplifier 2 were non-conductive it would produce an oscillation the frequency of which is lower than the resonant frequency of the circuit 4. However, the feedback-network of the amplifier 2 is a part of a common nature, since it also comprises the transformer 3, the circuit 4 and also an inductor 6 and parasitic capacitance 12 so that this amplifier, should the amplifier 1 be non-conductive, would tend to produce an oscillation, the frequency of which exceeds the resonant frequency of the circuit 4. The common coupling 3 and 4 virtually produces an oscillation, the frequency of which depends upon the amplification factor of each of the amplifiers 1 and 2, which amplification factor is controllable by a control signal supplied in push-pull to their control electrodes through terminals 7, 8.

According to the invention, the feedback-network 3, 4 is arranged in such a manner that an oscillation supplied from the anode of the amplifier 1 to the feedback-network produces a signal zero at the anode of the amplifier 2. For this purpose the network 3, 4 is a balanced T-network, in which the impedance measured between the terminals *a—a* with non-conductive amplifiers 1 and 2, consequently inclusive of the capacitor 5, the inductor 6 and the capacitances 11 and 12, is exactly equal to the impedance of the circuit 4. As a result of this expedient, aging phenomena, temperature- and supply voltage variations will only very slightly affect the frequency of the oscillation produced at the output terminal 10, since their influence is substantially balanced out. Moreover, the obtainable frequency sweep is a maximum, since the two oscillators 1–3–4–5 and 2–3–4–6 are substantially decoupled. For, the closer the relative coupling between the frequency-determining networks 3–4–5–11 and 3–4–6–12 is, the more these networks would tend to behave as a single circuit, and hence not produce a frequency sweep.

As a variant of the circuit arrangement shown in FIG. 1 the capacitor 5 and the inductor 6 may be replaced by suitable phase shifting networks to be inserted in the grid circuits of the amplifier 1 and 2.

In the example shown in FIG. 2, the feedback-network connecting the output of the amplifiers 1 and 2 respectively to their inputs, consists of two symmetrically disposed magic T's denoted by 15 and 16. The lead connecting the amplifier 1 to the magic T 15 exceeds by an electric length ΔL the lead connecting the amplifier 2 to this magic T 15. In this manner, the frequencies of the oscillations produced by each individual amplifier lie at both sides of the frequency of the oscillation virtually produced by the common coupling. This again permits frequency modulation by controlling the amplification factor of each of the amplifiers through terminals 7 and 8. The length ΔL should not have an excessively high value, lest the obtainable frequency sweep decrease again and the system tend to stop self-oscillating.

FIG. 3 shows the construction of the system represented in FIG. 2. The outputs of amplifiers 1 and 2, which may substantially be constructed as set out in Philips Technical Review 1957, 5, page 150, are connected to side arms 21 and 22 respectively of the magic T 15'. The output wave is taken from the guide 10' and a wave is returned through wave guide 23 to the input of magic T 16', two side arms 27 and 28 of which are connected to the inputs of amplifiers 1' and 2' respectively. An output conductor 24 of magic T 16' is connected to a matched load. The amplifiers 1' and 2' are tunable by means of adjusting screws 25 and 26. The path difference ΔL (FIG. 2) is obtained by means of a distance piece 29. This permits adjustment of the frequency control range as a function of a control signal to be supplied to supply leads 7' and 8' respectively. The phase of the feedback of amplifiers 1' and 2', hence the maximum obtainable frequency sweep, is adjustable by controlling the electric length of the feedback wave guide 23. Since the frequency sweep is determined by the quotient of the frequency sweep and the group transit time of the waves through the system of wave guides and amplifiers, this group transit time should be minimized.

FIG. 4 shows a variant of the magic T's 15' and 16' represented in FIG. 3, the external feedback wave guide 23 being replaced by a feedback wave guide 33 incorporated in a block of conductive material. The side arms 34, 35 and 36, 37 respectively are connected with the required electric length difference ΔL to the inputs and outputs respectively of the amplifiers. The matched load is connected to the side arm 38, while the output is taken from the side arm 39. This yields a more compact system, in which the group transit time of the waves is minimized.

The system according to the invention permits frequency modulated oscillations having a central frequency of 4000 mc./s., modulated by a video signal, to be produced. Dependent upon adjustment of the length ΔL, valves of the type EC57 yielded an amount of energy, for example 3.5 w., with a frequency sweep of approximately 5 mc./s. and 0.6 w. with a frequency sweep of approximately 25 mc./s. respectively. This amount of energy is sufficient for direct supply to a transmitter antenna for short-distance communication.

What is claimed is:

1. A variable frequency oscillator comprising a pair of amplifying elements each having an output circuit and an input circuit, a feedback circuit connected between said output and input circuits whereby each of said elements has a different natural frequency of oscillation, said feedback circuit providing quadrature components of opposite sign to said input circuits, means for varying the amplification factors of said elements, at least a portion of said feedback circuit being common to each of said elements whereby a common oscillation is produced, said feedback circuit being balanced with respect to said elements so that oscillations applied by the output circuit of one of said amplifying elements to said feed-back circuit do not appear at the output circuit of the other said amplifying element.

2. The oscillator of claim 1, in which said feedback circuit comprises a T-network, the series arm of said network comprising a transformer having a first winding connected between said output circuits and a second winding connected between said input circuits, the parallel arm of said T-network comprising a parallel resonant circuit.

3. The oscillator of claim 1, in which said feedback circuit comprises a pair of magic T's coupled together.

4. A variable frequency oscillator comprising a pair of amplifying elements each having an output circuit and an input circuit, a pair of magic T's each having a pair of side arms, an output arm and an input arm, means connecting the output circuits of said amplifying elements to separate side arms of one magic T whereby the connections from the output circuits to separate side arms have different electrical lengths, means connecting the input circuits of said amplifying elements to separate side arms of the other magic T, waveguide feedback means connecting the output arm of said one magic T to the input arm of said other magic T, and means for varying the amplification factors of said amplifying elements.

5. A variable frequency oscillator comprising a pair of amplifying elements each having an output circuit and an input circuit, a pair of magic T's each having a pair of side arms, an output arm and an input arm, means connecting the output and input circuits of one of said amplifying elements between one side arm of one of said magic T's and one side arm of the other magic T, means connecting the output and input circuits of the other said amplifying element between the other side arm of said one magic T and the other side arm of said other magic T, waveguide feedback means connecting the output arm of said one magic T to the input arm of said other magic T, and means for varying the amplification factors of said amplifying elements, one of said means connecting the input and output circuits to the side arms of said magic T's including a distance waveguide piece whereby the natural frequencies of oscillation of said two elements are different.

6. The oscillator of claim 5, in which said two magic T's and said feedback waveguide are incorporated in a block of conductive material.

References Cited in the file of this patent

UNITED STATES PATENTS

| | | |
|---|---|---|
| 2,150,241 | Nichols et al. | Mar. 14, 1939 |
| 2,691,734 | Beck et al. | Oct. 12, 1954 |
| 2,731,653 | Schroeder | Jan. 17, 1956 |
| 2,801,391 | Whitehead | July 30, 1957 |